(12) United States Patent
Yune

(10) Patent No.: US 9,620,520 B2
(45) Date of Patent: Apr. 11, 2017

(54) SEMICONDUCTOR DEVICE AND METHOD OF MANUFACTURING THE SAME

(71) Applicant: SK hynix Inc., Icheon-si, Gyeonggi-do (KR)

(72) Inventor: Hyoung Soon Yune, Seoul (KR)

(73) Assignee: SK hynix Inc., Icheon-si (KR)

(*) Notice: Subject to any disclaimer, the term of this patent is extended or adjusted under 35 U.S.C. 154(b) by 0 days.

(21) Appl. No.: 14/976,185

(22) Filed: Dec. 21, 2015

(65) Prior Publication Data
US 2017/0025432 A1    Jan. 26, 2017

(30) Foreign Application Priority Data

Jul. 20, 2015    (KR) .................. 10-2015-0102503

(51) Int. Cl.
| | | |
|---|---|---|
| H01L 21/336 | (2006.01) | |
| H01L 27/115 | (2006.01) | |
| H01L 27/11582 | (2017.01) | |
| H01L 27/02 | (2006.01) | |
| H01L 21/28 | (2006.01) | |
| H01L 21/3213 | (2006.01) | |

(52) U.S. Cl.
CPC .. *H01L 27/11582* (2013.01); *H01L 21/28282* (2013.01); *H01L 21/32133* (2013.01); *H01L 27/0207* (2013.01)

(58) Field of Classification Search
CPC .................. H01L 27/11556; H01L 27/11582
See application file for complete search history.

(56) References Cited

U.S. PATENT DOCUMENTS

2013/0153978 A1* 6/2013 Lee .................. H01L 29/66833
                                                                257/314

FOREIGN PATENT DOCUMENTS

KR    10-2016-0106977 A    9/2016

* cited by examiner

*Primary Examiner* — Daniel Shook
(74) *Attorney, Agent, or Firm* — William Park & Associates Ltd.

(57) ABSTRACT

The present disclosure may provide a semiconductor device with an enhanced integration. The device may include a lower pipe gate; an upper pipe gate including a first horizontal portion and first and second protrusions, the first horizontal portion being parallel to the lower pipe gate, the first and second protrusions extending from the first horizontal portion to the lower pipe gate and crossing each other so as to define a pipe channel region; a partition pipe gate disposed between the lower and upper pipe gates, the partition pipe gate dividing the pipe channel region into first and second pipe channel regions; and first and second pipe channel films disposed respectively in the first and second pipe channel regions.

10 Claims, 13 Drawing Sheets

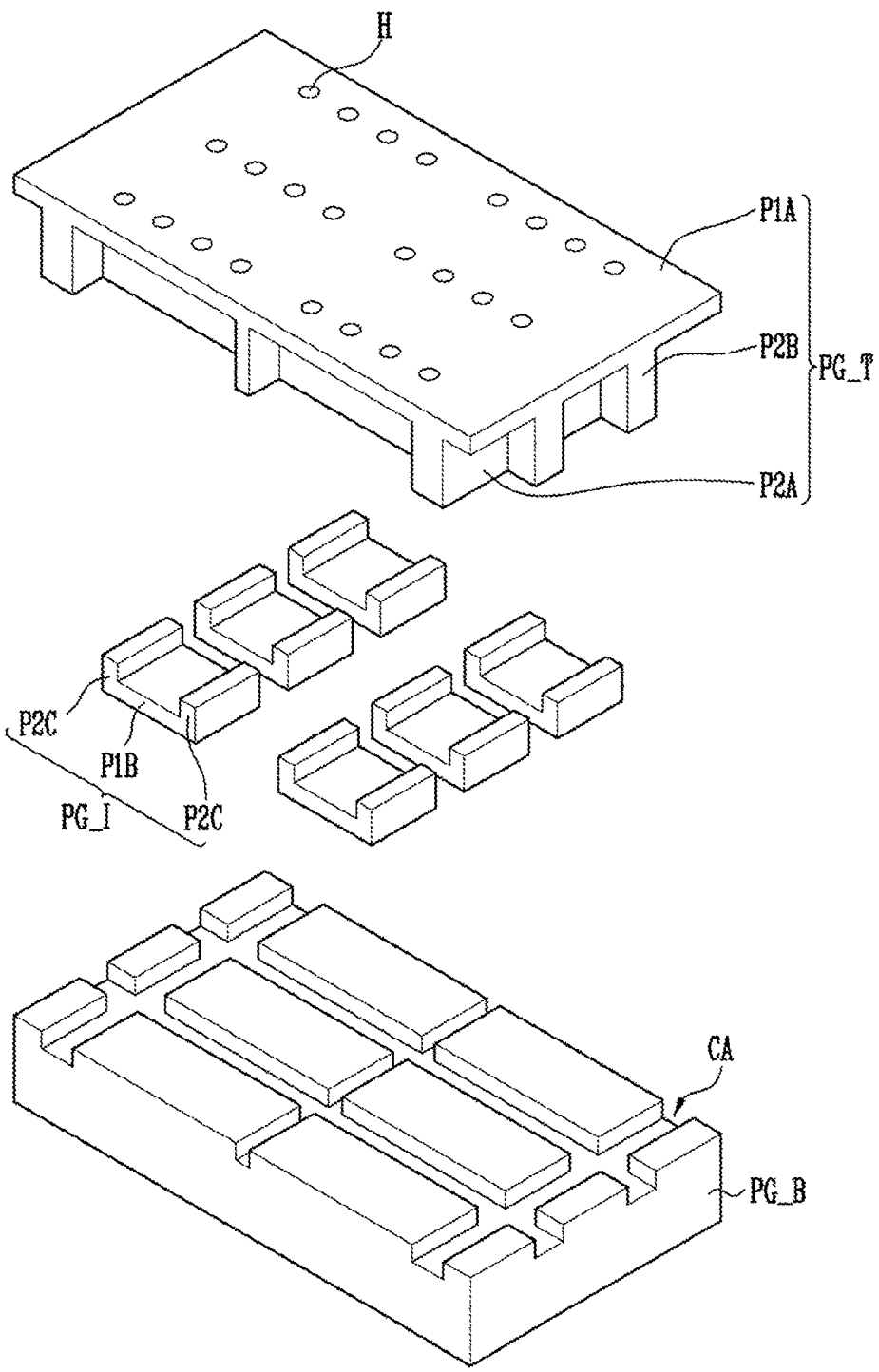

SEMICONDUCTOR DEVICE AND METHOD OF MANUFACTURING THE SAME

CROSS-REFERENCE TO RELATED APPLICATION

The present application claims priority to Korean patent application number 10-2015-0102503 filed on Jul. 20, 2015, in the Korean Intellectual Property Office, the entire disclosure of which is incorporated by reference herein.

BACKGROUND

1. Technical Field

The present disclosure relates to a semiconductor device and a method of manufacturing the same, and, in particular, a semiconductor device including a three-dimensional memory device and a method of manufacturing the same.

2. Description of the Related Art

A semiconductor device includes a memory device to store data therein. The memory device may include a memory string including a series arrangement of memory cells. A three-dimensional memory device has been created for a high degree integration of the semiconductor device.

The three-dimensional memory device has a plurality of 3D memory strings, each string including a vertical series of memory cells. There has been set forth a variety of configurations and approaches to achieve the vertical series of the memory cells.

SUMMARY

The present disclosure may provide a semiconductor device and a method of manufacturing the same to allow an improvement of an integration of a three-dimensional memory device.

In one aspect of the present disclosure, there is provided a semiconductor device comprising: a lower pipe gate; an upper pipe gate including a first horizontal portion and first and second protrusions, the first horizontal portion being parallel to the lower pipe gate, the first and second protrusions extending from the first horizontal portion to the lower pipe gate and crossing each other so as to define pipe channel regions; a partition pipe gate disposed between the lower and upper pipe gates, the partition pipe gate dividing each of the pipe channel regions into first and second pipe channel regions respectively corresponding to outer and inner regions of each of the pipe channel regions; and first and second pipe channel films disposed respectively in the first and second pipe channel regions.

In one aspect of the present disclosure, there is provided a method of manufacturing a semiconductor device, comprising: forming a first conductive film having first trenches formed therein, each of the first trenches extending in a first direction; forming a first sacrificial film filling the first trenches; etching the first sacrificial film to form second trenches, each second trench extending in the first direction; forming a second conductive film and a second sacrificial film on the second conductive film, the second conductive film being formed on an inner surface of each of the second trenches, and the second sacrificial film filling each of the second trenches; forming first slits dividing the first sacrificial film, the second conductive film and the second sacrificial film into a plurality of base patterns; forming a third conductive film having a horizontal portion covering the base patterns and protrusions extending from the horizontal portion so as to fill the first slits; and forming a pair of first holes and a pair of second holes, the first holes passing through the horizontal portion so as to expose the first sacrificial film of each of the base patterns, and the second holes passing through the horizontal portion so as to expose the second sacrificial film of each of the base patterns.

BRIEF DESCRIPTION OF THE DRAWINGS

FIG. 2A to FIG. 2C are views of a configuration of a pipe gate according to an embodiment of the present disclosure.

DETAILED DESCRIPTION

Figure 1:
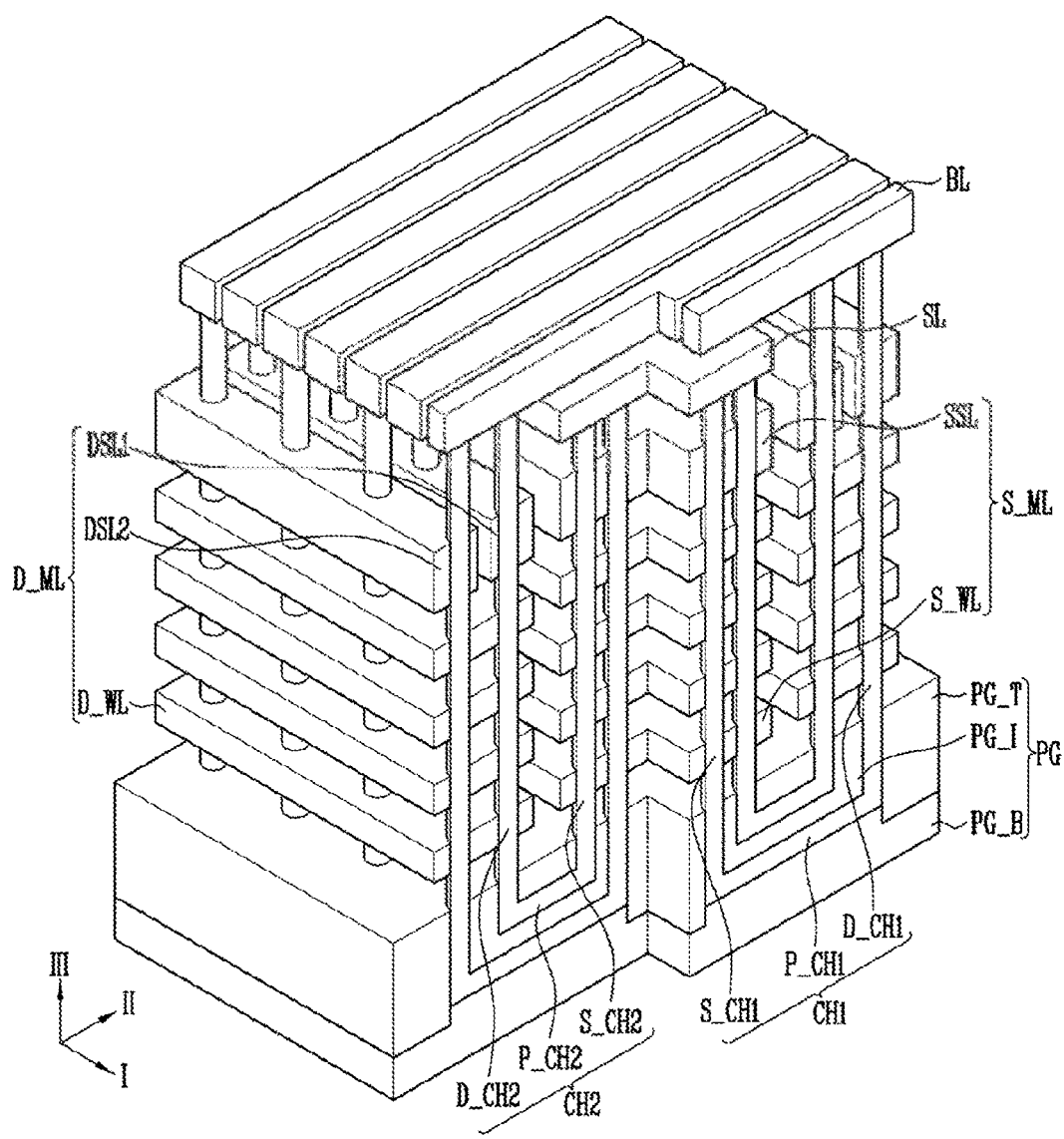
FIG. 1 is a perspective view of a semiconductor device according to an embodiment of the present disclosure.

Examples of various embodiments are illustrated in the accompanying drawings and described further below. It will be understood that the discussion herein is not intended to limit the claims to the specific embodiments described. On the contrary, it is intended to cover alternatives, modifications, and equivalents as may be included within the spirit and scope of the present disclosure as defined by the appended claims.

Example embodiments will be described in more detail with reference to the accompanying drawings. The present disclosure, however, may be embodied in various different forms, and should not be construed as being limited to only the illustrated embodiments herein. Rather, these embodiments are provided as examples so that this disclosure will be thorough and complete, and will fully convey aspects and features of the present disclosure to those skilled in the art.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from a spirit and scope of the present disclosure.

It will be understood that when an element or layer is referred to as being "connected to", or "coupled to" another element or layer, the element can be directly on, connected to, or coupled to the other element or layer, or one or more intervening elements or layers may be present. In addition, it will also be understood that when an element or layer is referred to as being "between" two elements or layers, the element or layer can be the only element or layer between the two elements or layers, or one or more intervening elements or layers may also be present.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or groups thereof. As used herein, the term "and/or" includes any and all combinations of one or more of the associated listed items. An expression such as "at least one of" when preceding a list of elements may modify the entire list of elements and does not necessarily modify the individual elements of the list.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In the following description, numerous specific details are set forth in order to provide a thorough understanding of the present disclosure. The present disclosure may be practiced without some or all of these specific details. In other instances, well-known process structures and/or processes have not been described in detail in order not to unnecessarily obscure the present disclosure.

Hereinafter, various embodiments of the present disclosure will be described in detail with reference to attached drawings.

FIG. 1 is a perspective view of a semiconductor device according to an embodiment of the present disclosure. To be specific, FIG. 1 is a perspective view of a three-dimensional memory device of the semiconductor device. In FIG. 1, an insulation film and memory film is not shown for the sake of convenience.

Referring to FIG. 1, the three-dimensional memory device according to an embodiment of the present disclosure may include a first channel film CH1, a second channel film CH2, a pipe gate PG, a source-side stack S_ML, and a drain-side stack D_ML.

The pipe gate PG may include a lower pipe gate PG_B, a partition pipe gate PG_I, and an upper pipe gate PG_T, all of which are made of conductive films. The lower pipe gate PG_B may form a lower portion of the pipe gate PG. The upper pipe gate PG_T may include a horizontal portion parallel to the lower pipe gate PG_B and protrusions extending from the horizontal portion toward the lower pipe gate PG_B. The protrusions of the upper pipe gate PG_T may extend to the lower pipe gate PG_B to be in a contact with the lower pipe gate PG_B. The protrusions of the upper pipe gate PG_T may define pipe channel regions. The partition pipe gate PG_I may be disposed between the lower pipe gate PG_B and the upper pipe gate PG_T so as to divide each of the pipe channel regions into first and second pipe channel regions. The partition pipe gate PG_I may be formed in a U-shape. Details of a configuration of the pipe gate PG may be described below with reference to FIG. 2A to FIG. 2C.

The first channel film CH1 may include a first pipe channel P_CH1, a first drain-side channel D_CH1, and a first source-side channel S_CH1. The first drain-side channel D_CH1 and the first source-side channel S_CH1 may respectively extend and protrude from the first pipe channel P_CH1. The first pipe channel P_CH1 may be disposed within the first pipe channel region defined by the lower pipe gate PG_B, the partition pipe gate PG_I, and the upper pipe gate PG_T. The first pipe channel P_CH1 may be formed in a U-shape along an upper surface of the lower pipe gate PG_B and side-walls of the protrusions of the upper pipe gate PG_T. The first source-side channel S_CH1 and the first drain-side channel D_CH1 may extend respectively from both ends of the first pipe channel P_CH1 to pass through the horizontal portion of the upper pipe gate PG_T. The first source-side channel S_CH1 and the first drain-side channel D_CH1 may extend beyond the horizontal portion of the upper pipe gate PG_T.

The second channel film CH2 may include a second pipe channel P_CH2, a second drain-side channel D_CH2, and a second source-side channel SCH2. The second drain-side channel DCH2 and second source-side channel S_CH2 may respectively extend and protrude from the second pipe channel P_CH2. The second pipe channel P_CH2 may be disposed within the second pipe channel region defined by the partition pipe gate PG_I and the upper pipe gate PG_T. The second source-side channel SCH2 and the second drain-side channel DCH2 may extend respectively from both ends of the second pipe channel P_CH2 so as to pass through the horizontal portion of the upper pipe gate PG_T. The second source-side channel SCH2 and the second drain-side channel D_CH2 may extend beyond the horizontal portion of the upper pipe gate PG_T.

The second source-side channel S_CH2 and the second drain-side channel D_CH2 may be disposed between the first source-side channel S_CH1 and the first drain-side channel D_CH1. The first and second source-side channels S_CH1 and S_CH2 may be adjacent to each other, while the first and second drain-side channels D_CH1 and D_CH2 may be adjacent to each other. The first and second source-side channels S_CH1 and S_CH2 and the first and second drain-side channels D_CH1, and D_CH2 may extend from both ends of the first pipe channel P_CH1 and both ends of the second pipe channel P_CH2. The both ends of the first pipe channel P_CH1 and the both ends of the second pipe channel P_CH2 may be coplanar. In this way, it may simplify a process to form holes in which the first and second source-side channels S_CH1 and S_CH2 and the first and second drain-side channels D_CH1 and D_CH2 are disposed.

The second pipe channel P_CH2 may overlap with the first pipe channel P_CH1. The first pipe channel P_CH1 may extend toward both ends of the second pipe channel P_CH2 to have non-overlapped portions at both ends thereof. Both ends of the first pipe channel P_CH1 may extend respectively toward the first drain-side channel D_CH1 and the first source-side channel S_CH1. In this way, the first pipe channel P_CH1 may be formed in a U-shape.

The first channel film CH1 and the second channel film CH2 may be disposed respectively in through-holes defined in a conformal shape respectively to the first channel film CH1 and the second channel film CH2. Each of the first channel film CH1 and the second channel film CH2 may be made of a tube-structured semiconductor film surrounding an insulation material filling in a central region of a corresponding through-hole. Alternatively, each of the first channel film CH1 and the second channel film CH2 may be made of a buried semiconductor film filled from a surface to a central region of a corresponding through-hole. Otherwise, each of the first channel film CH1 and the second channel film CH2 may be formed of a combination of the tube-structured and buried films. Although not shown in the figure, each of the first channel film CH1 and the second channel film CH2 may have an outer wall surrounded with a data storage film. Further, between the data storage film and the first channel film CH1 and/or between the data storage film and the second channel film CH, there may be formed a tunnel insulation film. The data storage film may have an outer wall surrounded with a blocking insulation film.

The source-side stack S_ML and the drain-side stack D_ML may be separated from each other by a slit formed between the second drain-side channel D_CH2 and the second source-side channel S_CH2.

The source-side stack S_ML may surround the first source-side channel S_CH1 and the second source-side channel S_CH2, and include a stack of spaced source-side conductive patterns above the upper pipe gate PG_T. The source-side conductive patterns may include source-side word-lines S_WL, and at least one layer of a source select line SSL disposed above the source-side word-lines S_WL. The source select line SSL may have a same thickness as the source-side word-lines S_WL or may have a larger thickness than the source-side word-lines S_WL. The source select line SSL may be spaced apart from the source-side word-lines S_WL. The source-side word-lines S_WL and source select line SSL may extend in a first direction I.

The source select line SSL may surround all of adjacent two columns of the first source-side channels S_CH1 and two columns of the second source-side channels S_CH2. Otherwise, the source select line SSL may be divided into first to fourth lines, each line surrounding each of the adjacent two columns of the first source-side channels S_CH1 and the two columns of the second source-side channels S_CH2. In an alternative, the source select line SSL may be divided into first and second lines, the first line surrounding the adjacent two columns of the first source-side channels S_CH1 and the second line surrounding the two columns of the second source-side channels S_CH2.

Each of the source-side word-lines S_WL may surround all of the adjacent two columns of the first source-side channel S_CH1 and the two columns of the second source-side channel S_CH2. Otherwise, the source-side word-lines S_WL may be divided into first to fourth lines, each line surrounding each of the adjacent two columns of the first source-side channel S_CH1 and the two columns of the second source-side channel S_CH2. In an alternative, the source-side word-lines S_WL may be divided into first and second lines, the first line surrounding the adjacent two columns of the first source-side channel S_CH1 and the second line surrounding the two columns of the second source-side channel S_CH2.

The drain-side stack D_ML may surround the first drain-side channel D_CH1 and the second drain-side channel D_CH2 and include a stack of spaced drain-side conductive patterns above the upper pipe gate PG_T. The drain-side conductive patterns may include drain-side word-lines D_WL, and at least one layer of drain select lines DSL1 and DSL2 above the drain-side word-lines D_WL. The drain select lines DSL1 and DSL2 may be spaced from the drain-side word-lines D_WL. The drain-side word-lines D_WL and drain select lines DSL1 and DSL2 may extend in the first direction I.

Among the drain select lines DSL1 and DSL2, the first drain select line DSL1 may surround one column of the first drain-side channels D_CH1, while the second drain select line DSL2 may surround one column of the second drain-side channels D_CH2. In an alternative, all of the one column of the first drain-side channels D_CH1 and one column of the second drain-side channels D_CH2 may be surrounded with a single drain select line.

Each of the drain-side word-lines D_WL may surround all of the one column of the first drain-side channels D_CH1 and the one column of the second drain-side channels D_CH2. Otherwise, each of the drain-side word-lines D_WL may be divided into first and second lines, the first line surrounding the one column of the first drain-side channels D_CH1, and second line surrounding the one column of the second drain-side channels D_CH2.

The source-side stack S_ML and the drain-side stack D_ML may have the same height. Above the source-side stack S_ML and the drain-side stack D_ML, there may disposed a source line SL and bit-lines BL. The source line SL and the bit-lines BL may be spaced from each other. In one example, the bit-lines BL may be disposed above and spaced from the source line SL.

The source line SL may be connected to both of the first source-side channel film S_CH1 and the second source-side channel film S_CH2. The source line SL may extend in the first direction I.

The bit-lines BL may extend in a direction crossing the first direction I. In one example, the bit-lines BL may extend in a second direction II perpendicular to the first direction I. The bit-lines BL may each be connected to the first and second drain-side channels D_CH1 and D_CH2 arranged along the extension direction of each bit-line.

In the above configuration, at an intersection of the pipe gate PG and the first channel film CH1 or at an intersection of the pipe gate PG and the second channel film CH2, a pipe transistor may be disposed. At each of the intersections of the word-lines D_WL, S_WL and the first channel film or each of intersections of the word-lines D_WL, S_WL and the second channel film CH2, each of a plurality of memory cells may be formed. At an intersection of the source select line SSL and the first channel film CH1 or an intersection of the source select line SSL and the second channel film CH2, a source select transistor may be disposed. At each intersection of the first drain select lines DSL1 and the first channel film CH1 or each intersection of the second drain select line DSL2 and the second channel film CH2, a drain select transistor may be disposed. In this way, a first memory string including the drain select transistor, memory cells, pipe transistor and source select transistor, all of which being connected to each other in a series manner via first channel film CH1 may be formed between a single bit-line BL and the source line SL. Further, a second memory string including the drain select transistor, memory cells, pipe transistor and source select transistor, all of which being connected to each other in a series manner via second channel film CH2 may be formed between a single bit-line BL and the source line SL. The second memory string region may be defined within the first memory string region, leading to an improved integration of the memory device in a limited space, in accordance with this implementation of the present disclosure.

Figure 2B:
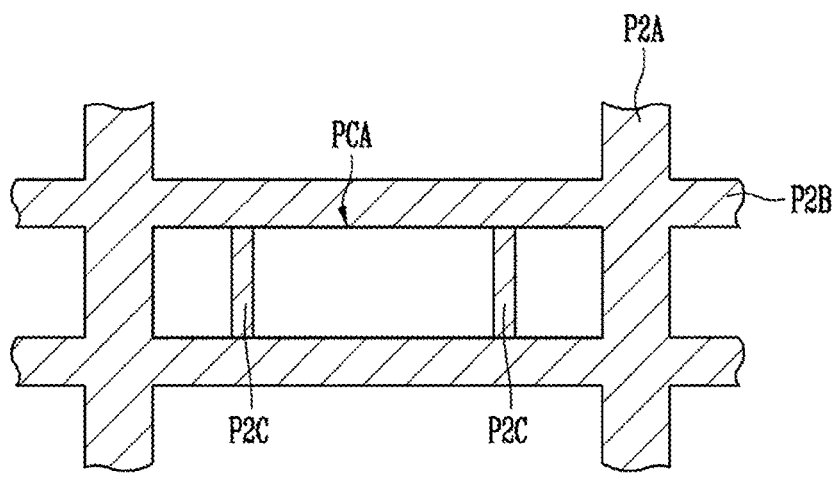
Figure 2C:
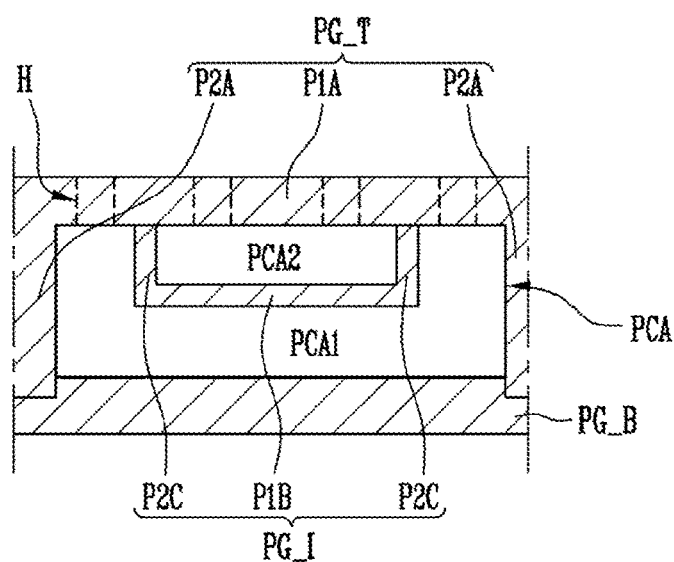

FIG. 2A to FIG. 2C are views of a configuration of a pipe gate according to an embodiment of the present disclosure. To be specific, FIG. 2A is an exploded perspective view of the pipe gate. FIG. 2B is a plan view of a layout of protrusions of the upper pipe gate and protrusions of the partition pipe gate. FIG. 2C is a cross-sectional view taken along an extension direction of the pipe channel region of the pipe gate in an assembled state thereof in which the lower pipe gate, the partition pipe gate, and the upper pipe gate are assembled.

Referring to FIG. 2A to FIG. 2C, the pipe gate may include the lower pipe gate PG_B, the upper pipe gate PG_T, and the partition pipe gate PG_I disposed between the lower pipe gate PG_B and the upper pipe gate PG_T. The lower pipe gate PG_B and the upper pipe gate PG_T together may define the pipe channel region PCA. The partition pipe gate PG_I may be constructed to divide the pipe channel region PCA into a first pipe channel region PCA1 and a second pipe channel region PCA2.

In one example, the upper pipe gate PG_T may include a first horizontal portion P1A and first and second protrusions P2A and P2B protruding from the first horizontal portion P1A. The first horizontal portion P1A may be disposed above and spaced from the lower pipe gate PG_B and may be parallel to the lower pipe gate PG_B. The first and second protrusions P2A and P2B may extend from the first horizontal portion P1A toward the lower pipe gate PG_B and may cross each other. The first and second protrusions P2A and P2B may extend to the lower pipe gate PG_B and be in a contact with the lower pipe gate PG_B. In this way, between the first horizontal portion P1A and the lower pipe gate PG_B, there may be defined a pipe channel region PCA defined by the first and second protrusions P2A and P2B.

Recesses CA may receive the first and second protrusions P2A and P2B may be formed in a surface portion of the lower pipe gate PG_B.

The partition pipe gate PG_I may include a second horizontal portion P1B and third protrusions P2C respectively extending from both ends of the second horizontal portion P1B. The second horizontal portion P1B may be disposed between and spaced from the lower pipe gate PG_B and the first horizontal portion P1A. The second horizontal portion P1B may have a shorter side-to-side length than the pipe channel region PCA, and have the same width as the pipe channel region PCA. The second horizontal portion P1B may overlap with a central region of the pipe channel region PCA so that both ends of the pipe channel region PCA are opened. The first protrusions P2A may sandwich the pipe channel region PCA therebetween and may face each of the third protrusions P2C respectively. The third protrusions P2C may respectively extend from both ends of the second horizontal portion P1B to the first horizontal portion P1A. The third protrusions P2C may have the same width as the pipe channel region PCA. The second horizontal portion P1B and the third protrusions P2C may be coupled to the second protrusions P2B. A cross-sectional shape of the partition pipe gate PG_I taken in a longitudinal direction thereof may be U-shape.

In the above pipe gate, the pipe channel region PCA may have an outer portion occupying both ends and a lower portion of the pipe channel region PCA, the outer portion being referred to as the first pipe channel region PCA1. An inner region of the pipe channel region PCA occupying a remaining central upper portion may be referred to as the second pipe channel region PCA2. The first pipe channel region PCA1 may include a horizontal portion below the second horizontal portion P1B of the partition pipe gate PG_I and both ends portions. The both ends of the first pipe channel region PCA1 may be respectively between the first protrusions P2A and the third protrusions P2C. This may result in a U-shaped first pipe channel region PCA1. The second pipe channel region PCA2 may be defined by the partition pipe gate PG_I and the first horizontal portion P1A, and the second pipe channel region PCA2 may overlap with the first pipe channel region PCA1.

In the first pipe channel region PCA1, there may be disposed the first pipe channel P_CH1 as shown in FIG. 1, while in the second pipe channel region PCA2, there may be disposed the second pipe channel P_CH2 as shown in FIG. 1. Through-holes H may pass through the first horizontal portion P1A of the upper pipe gate PG_T. The through-holes H may not overlap with the first to third protrusions P2A to P2C, and may be filled, respectively with bottoms of the first and second drain-side channels D_CH1 and D_CH2 and the first and second source-side channels S_CH1 and S_CH2 as shown in FIG. 1. An arrangement of the holes H may correspond to an arrangement of the first and second drain-side channels D_CH1 and D_CH2 and the first and second source-side channels S_CH1 and S_CH2. The arrangement of the first and second drain-side channels D_CH1 and D_CH2 and the first and second source-side channels S_CH1 and S_CH2 may vary depending on a layout of the pipe channel region PCA.

Figure 3A:
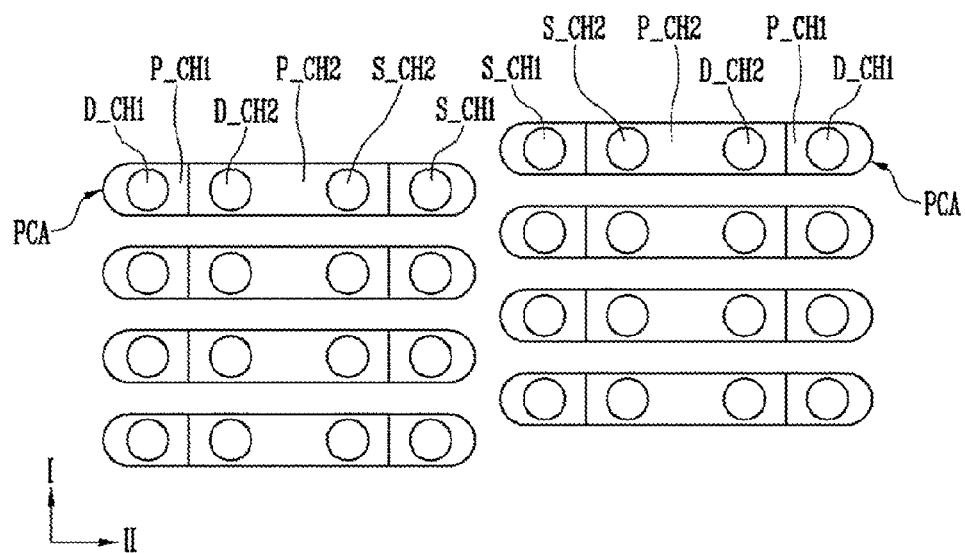
FIG. 3A to FIG. 3C are plan views of various arrangements of a pipe channel regions in accordance with embodiments of the present disclosure.
Figure 3B:
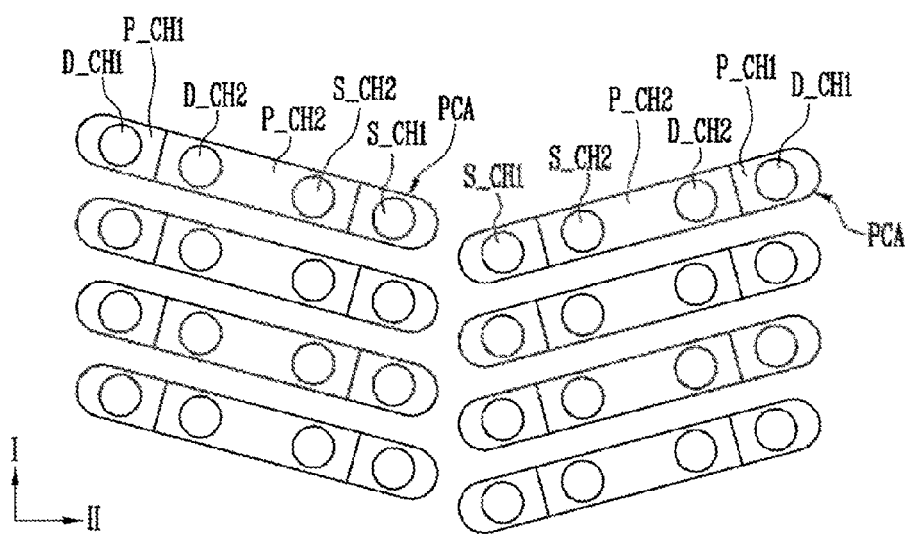
Figure 3C:
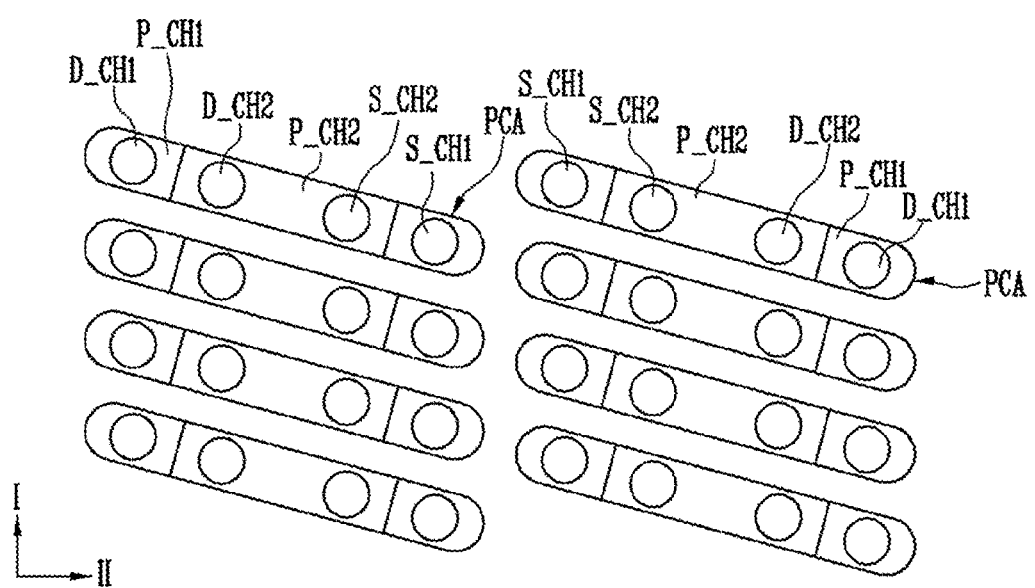

FIG. 3A to FIG. 3C are plan views of various arrangements of the pipe channel regions in accordance with embodiments of the present disclosure.

Referring to FIG. 3A to FIG. 3C, the pipe channel regions PCA may be arranged in a matrix-form where the regions may arranged in the first direction I and the second direction II perpendicularly crossing each other. The first direction I may be an extension of the direction of the source-side conductive patterns S_WL, SSL and the drain-side conductive patterns D_WL, DSL1, DSL2 in FIG. 1. The second direction II may be an extension of the direction of the bit-line BL in FIG. 1. In the pipe channel region PCA, there may be disposed the first pipe channel P_CH1 and the second pipe channel P_CH2, while both ends of the first pipe channel P_CH1 may be exposed respectively at both ends of the second pipe channel P_CH2. To the both ends of the first pipe channel P_CH1, there may be coupled the first drain-side channel D_CH1 and the first source-side channel S_CH1. To the both ends of the second pipe channel P_CH2, there may be coupled the second drain-side channel D_CH2 and the second source-side channel S_CH2.

The pipe channel regions PCA may have a zig-zag or staggered arrangement to improve an integration of the memory device. In one example, while the pipe channel regions PCA may be arranged in a linear manner in the first direction I, centers of the pipe channel regions PCA may be arranged in a zig-zag or staggered form in the second direction II.

In another example, the pipe channel regions PCA may be arranged, as in FIG. 3A, in the second direction II. In alternatives, the pipe channel regions PCA may be arranged, as in FIG. 3B and FIG. 3C, in directions crossing, in a non-perpendicular manner, with the first direction I and the second direction II.

In FIG. 3B, adjacent pipe channel regions PCA in the second direction II may extend in a symmetrical manner with each other, while, in FIG. 3C, adjacent pipe channel regions PCA in the second direction II may extend in the same direction.

Hereinafter, FIG. 4A to FIG. 13 illustrate a method of manufacturing the semiconductor device according to an embodiment of the present disclosure.

Figure 4A:
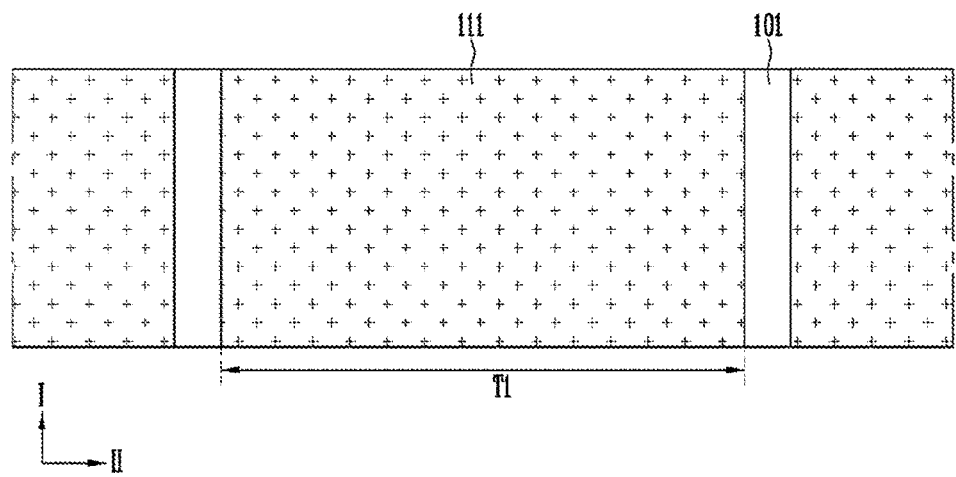
FIG. 4A to FIG. 13 illustrates a method of manufacturing the semiconductor device according to an embodiment of the present disclosure.
Figure 4B:
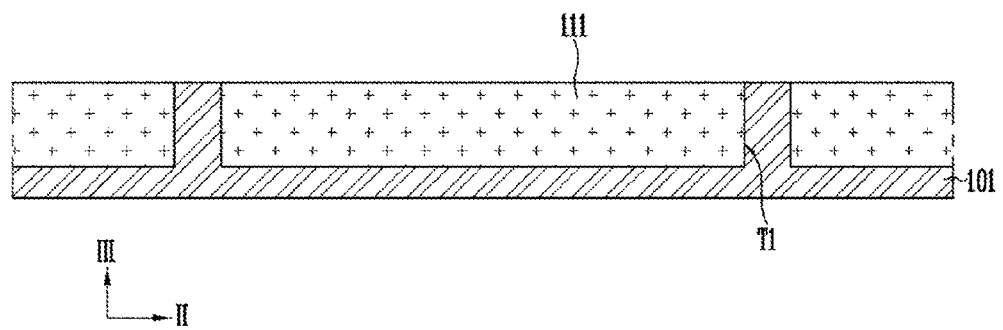

FIG. 4A and FIG. 4B respectively are top and cross-sectional views illustrating a step of forming first trenches and first sacrificial films.

Referring to FIG. 4A and FIG. 4B, on a substrate (not shown), there may be formed a first conductive film 101. The first conductive film 101 may be used as the lower pipe gate.

The first conductive film 101 may be etched to form first trenches T1 extending in the first direction I. The first trenches T1 may be arranged in a spaced manner in the second direction II crossing perpendicularly the first direction I. The etching of the first trench T1 may include a photolithography process. Since the first trench T1 may be formed in a linear form in the first direction I and the first trench T1 may have a larger width than a target as the pipe channel region, a photolithography type including a liquid immersion lithography may be not employed. For the photolithography process, a light source such as KrF or ArF, etc. may be employed.

After this, the first trench T1 may be filled with a first sacrificial film 111. The first sacrificial film 111 may be made of a different material than the first conductive film 101. To be specific, the first sacrificial film 111 may be made of a material with a different etching selection rate than the first conductive film 101. In one example, the first sacrificial film 111 may be made of a TiN. The first sacrificial film 111 may be subjected to a planarization until the first conductive film 101 is exposed. In this way, the first sacrificial film 111 may be disposed only within the first trenchesT1.

Figure 5A:
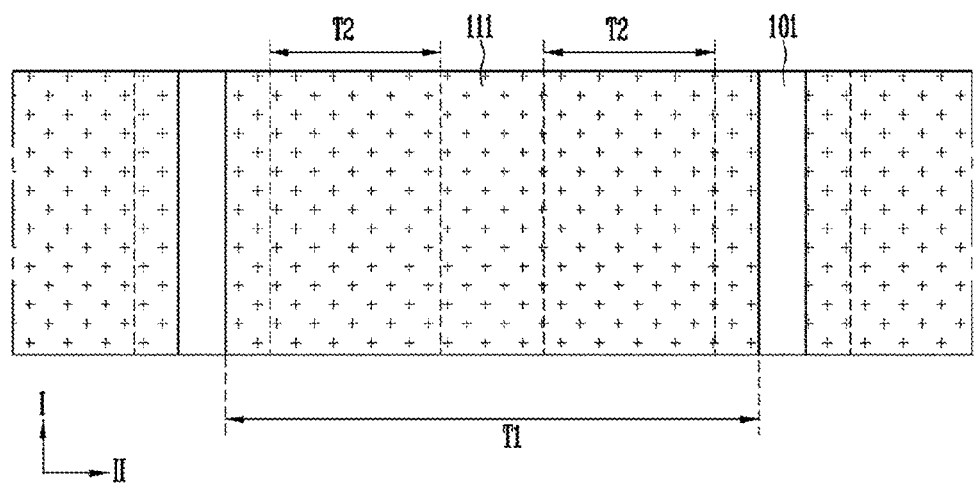
Figure 5B:
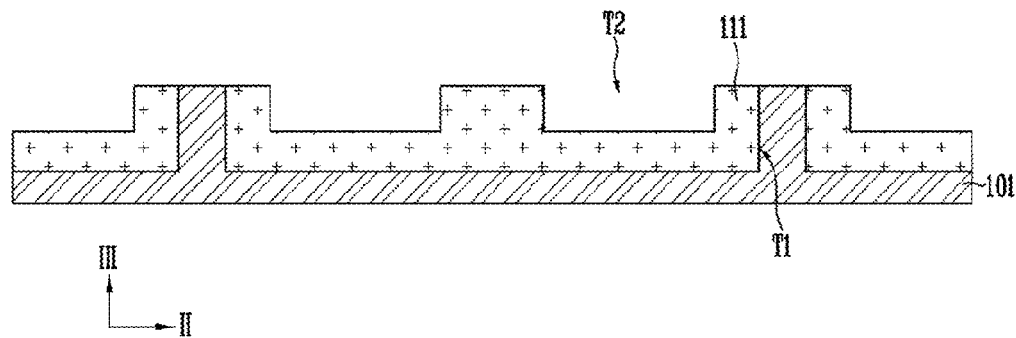

FIG. 5A and FIG. 5B respectively are top and cross-sectional views illustrating a step of forming second trenches.

Referring to FIG. 5A and FIG. 5B, via an etching of the first sacrificial film 111, second trenches T2 may be formed, each trench extending in the first direction I. In the first trench T1, at least two second trenches T2 may be arranged in a parallel manner. Each of the second trenches T2 may define a second pipe channel region. The etching of the second trenches T2 may include a photolithography process. Since each of the second trenches T1 may be formed in a linear manner in the first direction I, a photolithography type including a liquid immersion lithography may be not employed. For the photolithography process, a light source such as KrF or ArF, etc. may be employed.

Figure 6:
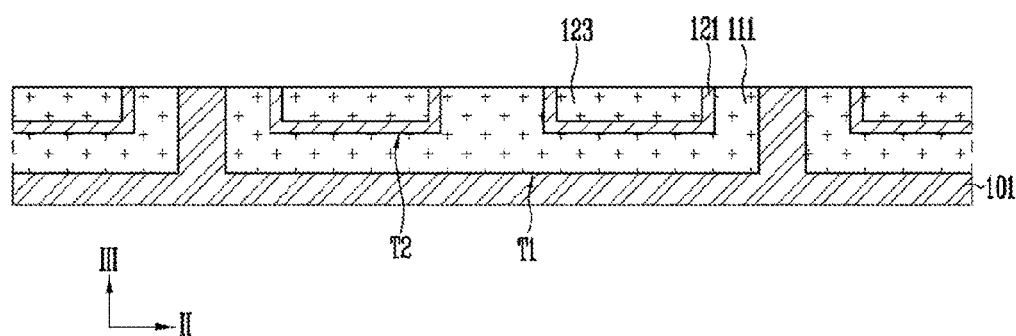

FIG. 6 is a cross-sectional view illustrating a step of forming material films filling each of the second trenches.

Referring to FIG. 6, within in each of the second trenches T2, there may be formed a second conductive film 121 on a surface of the trench T2, and a second sacrificial film 123 formed on the second conductive film 121.

The second conductive film 121 may act as the partition pipe gate, and thus function to divide the pipe channel region into the first pipe channel region and the second pipe channel region. The second conductive film 121 may be formed along an inner surface of each of the second trenches T2 to open a central region of each of the second trenches T2.

The sacrificial film 123 may be made of a different material than the first and second conductive films 101 and 121. To be specific, the second sacrificial film 123 may be made of a material with a different etching selection rate from the first and second conductive films 101 and 121. The second sacrificial film 123 may be made of the same material as the first sacrificial film 111. In one example, the second sacrificial film 123 may be made of a TiN. The second sacrificial film 123 may fill each of the second trenches T2 and may be disposed on the second conductive film 121.

The second conductive film 121 and the second sacrificial film 123 may be subjected to a planarization until the first conductive film 101 is exposed. In this way, the second conductive film 121 and the second sacrificial film 123 may only remain within the second trenches T2.

Figure 7A:
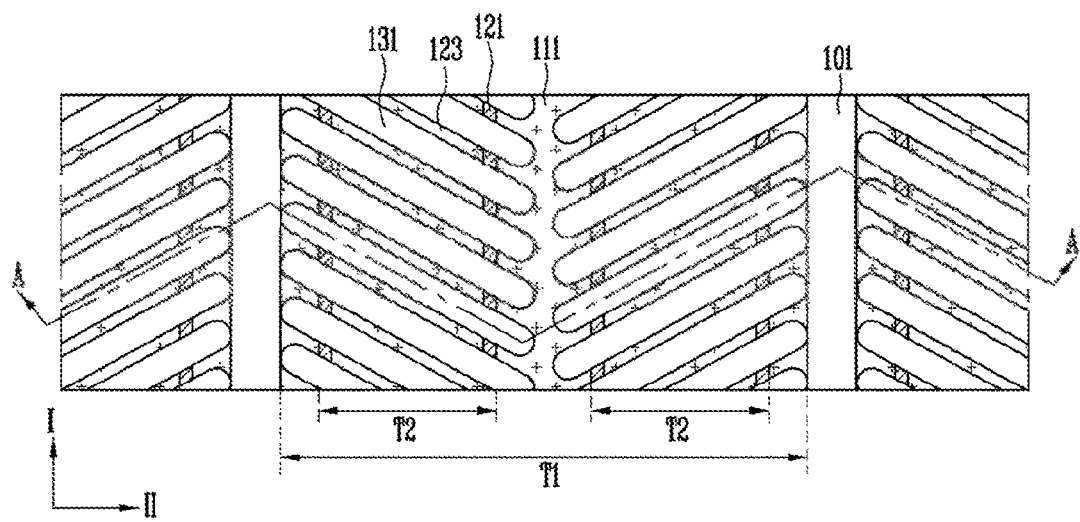
Figure 7B:
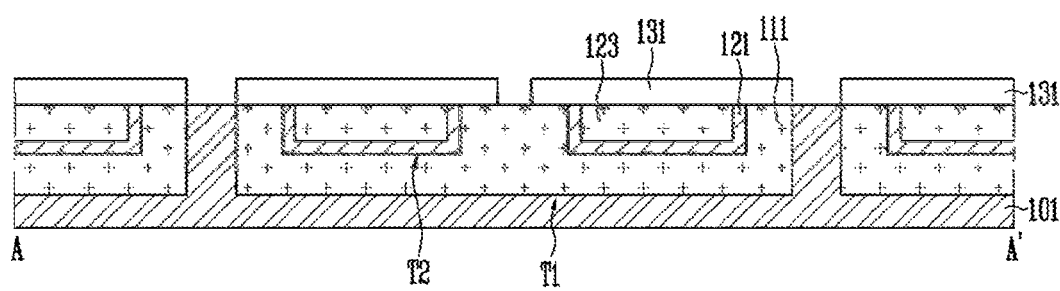

FIG. 7A and FIG. 7B respectively are top and cross-sectional views illustrating a step of forming a mask pattern defining the pipe channel region. To be specific, FIG. 7B is a cross-sectional view taken along a line "A-A" projected in a direction illustrated in FIG. 7A.

Referring to FIG. 7A and FIG. 7B, a mask pattern 131 defining the pipe channel region may be disposed on the first sacrificial film 111, where the first sacrificial film 111 fills the first trench T1. The mask patterns 131 may be arranged parallel to each other along an extension direction of each of the second trenches T2. The mask pattern 131 may be formed to cover not only a portion of the first sacrificial film 111, but also portions of the second conductive film 121 and the second sacrificial film 123 filling each of the second trenches T2.

The mask patterns 131 may have a layout corresponding to a layout of the pipe channel region. In one example, the layout of the mask patterns 131 may correspond to each of the layouts of the pipe channel regions PCA as shown in FIG. 3A to FIG. 3C. The mask patterns 131 may be implemented in a photoresist pattern formed using a photolithography process. In order to improve an integration of the memory device, the mask patterns 131 may be arranged in a compact manner using a liquid immersion lithography. In this process, a light source may employ an ArF.

The mask pattern 131 may be formed to leave exposed a portion of the first conductive film 101 along a side-wall of the first trench T1, and the mask pattern 131 may be formed to leave exposed a portion of the first sacrificial film 111 between the second trenches T2. The mask pattern 131 may be formed to cover portions of the first sacrificial film 111 respectively at both ends of each of the second trenches T2.

Figure 8A:
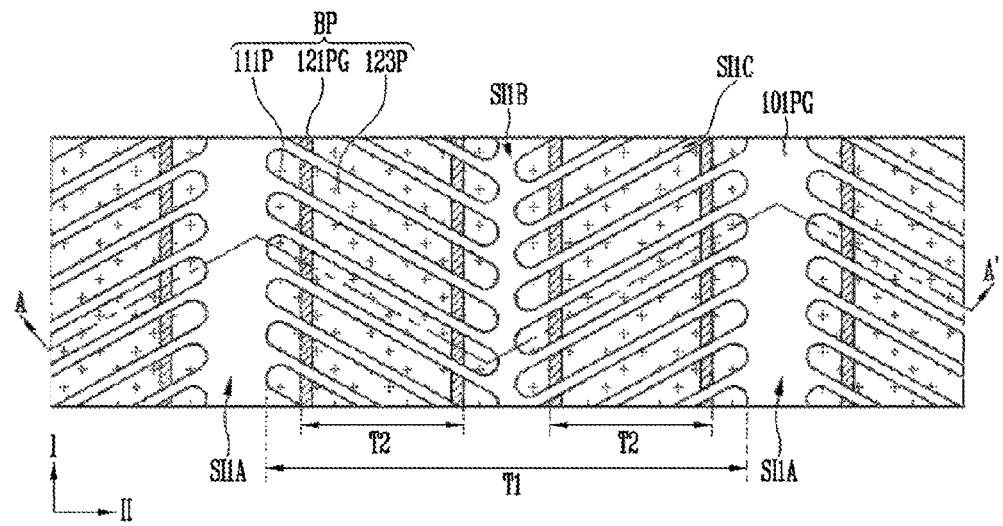
Figure 8B:
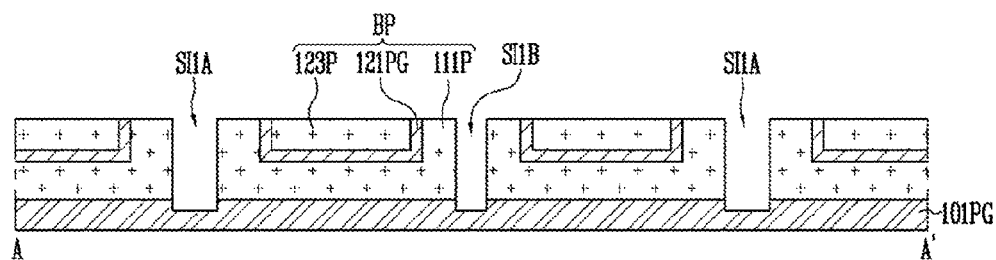

FIG. 8A and FIG. 8B are respectively top and cross-sectional views illustrating a step of forming a base pattern in the pipe channel region. To be specific, FIG. 8B is a cross-sectional view taken along a line "A-A" projected in a direction illustrated in FIG. 8A.

Referring to FIG. 8A and FIG. 8B, first slits SI1A, SI1B, and SI1C may be formed by etching the first sacrificial film 111, the second conductive film 121 and the second sacrificial film 123 using the mask pattern 131 in FIG. 7A and FIG. 7B as an etching barrier. In the course of etching the first slits SI1A, SI1B, and SI1C, the first conductive film 101 may be etched. In this way, base patterns BP are formed. The base patterns BP are separated by the first slits SI1A, SI1B, and SI1C. Each of the base patterns BP includes the first sacrificial film 111P, the second conductive film pattern 121PG and the second sacrificial film pattern 123P.

The base patterns BP may be arranged in a matrix-form, the matrix having the first direction I and the second direction II. The base patterns BP may be arranged in a linear manner along the first direction I, while the base patterns BP may also be arranged in a staggered manner along the second direction II, in order to improve an integration of the memory device.

The first slits SI1A, SI1B, and SI1C may include the first type slits SI1A, the second type slit SI1B and the third type slits SI1C.

The first type slits SI1A may extend in the first direction I so as to sandwich therebetween at least two columns of the base patterns BP. To be more specific, the first type slits SI1A may sandwich therebetween a region in which the first trench T1 is disposed. The first type slits SI1A may be formed by etching a portion of the first conductive film 101 formed along the first trench T1 side-wall. The first type slits SI1A may be formed to respectively expose the side-wall of the first sacrificial film pattern 111P.

The second type slit SI1B may be formed between the adjacent second trenches T2 and extend in the first direction I. The second type slit SI1B may have a larger depth than the first trench T1 so as to separate the first sacrificial film pattern 111P.

The third type slits SI1C may extend in a direction crossing with the first direction I so as to connect the first type slits SI1A and the second type slit SI1B. The base patterns BP may also extend along the extension direction of the third type slits SI1C. The extending direction of the third type slits SI1C and base patterns BP may correspond to an extending direction of the pipe channel region. In one example, the extending direction of the third type slits SI1C and base patterns BP may correspond to an extending direction of the pipe channel region PCA as shown in FIG. 3A to FIG. 3C. To be specific, the extending direction of the third type slits SI1C and base patterns BP may extend in the second direction II crossing perpendicularly with the first direction I, or a direction crossing in a non-perpendicular manner with the first and second directions I and II.

The first slits SI1A, SI1B, SI1C may have a larger depth than the first trench T1. Thus, the first conductive film pattern 101PG may be formed with the first slits SI1A, SI1B, SI1C passing through a partial thickness of the first conductive film pattern 101PG.

Via above process, the base patterns BP may have a planar surface.

Figure 9:
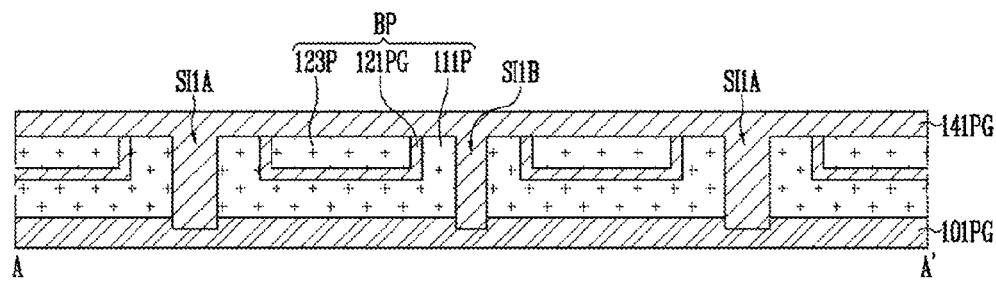

FIG. 9 is a cross-sectional view illustrating a forming process of a third conductive film.

Referring to FIG. 9, the base patterns BP may be covered with a third conductive film 141PG. The third conductive film 141PG may act as the upper pipe gate. The third conductive film 141PG may have a planar surface. The third conductive film 141PG may include the horizontal portion covering the base patterns BP and protrusions extending from the horizontal portion toward the first conductive film pattern 101PG so as to fill the first slits SI1A, SI1B, and SI1C.

Figure 10A:
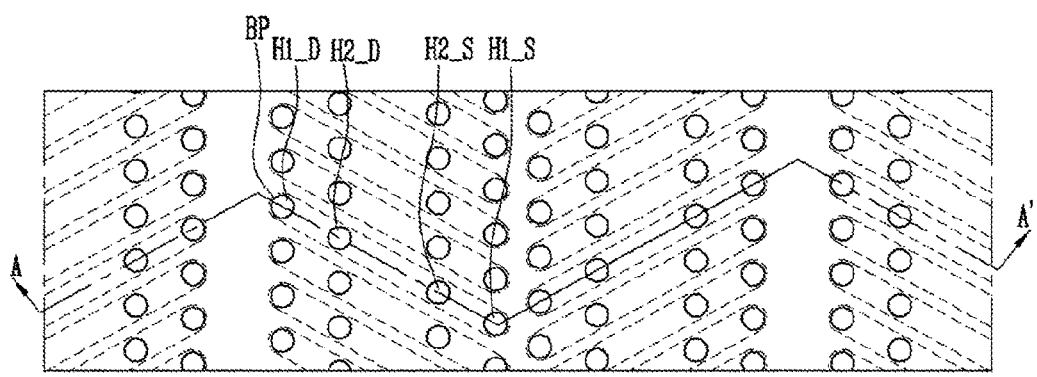
Figure 10B:
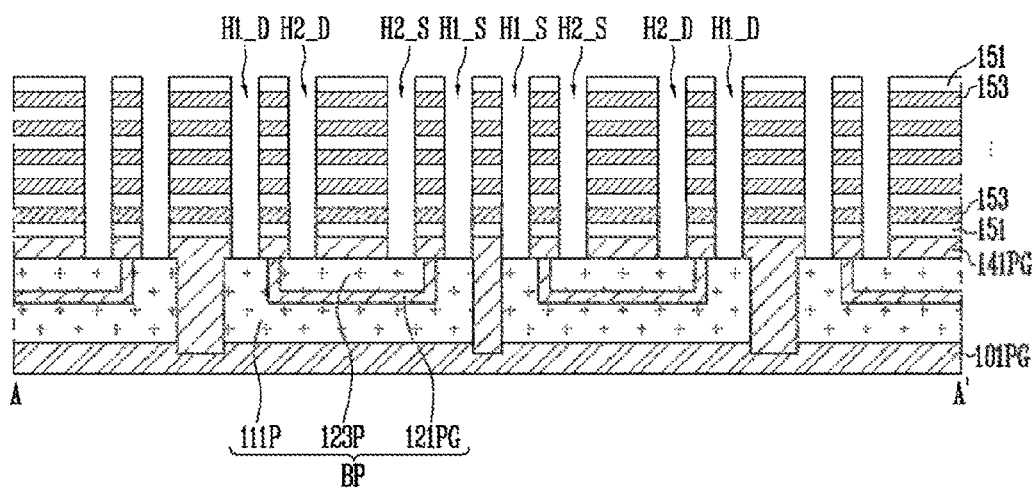

FIG. 10A and FIG. 10B respectively are top and cross-sectional views illustrating a step of forming holes opening the base patterns. To be specific, FIG. 10B is a cross-sectional view taken along a line "A-A" direction in FIG. 10A.

Referring to FIG. 10A and FIG. 10B, over the third conductive film 141PG, there may be a stack of alternations of first material films 151 and second material films 153. Each of the second material films 153 may define a region in which each conductive pattern is disposed, while each of the first material films 151 may define a region in which each interlayer insulation patterns is disposed.

The second material films 153 may be made of a different material from the first material films 151. In one example, the first material films 151 may be made of an insulation film for interlayer insulation patterns, while the second material films 153 may be made of a conductive film for word-lines and select lines.

In an alternative, the first material films 151 may be made of an insulation film for an interlayer insulation pattern, while the second material films 153 may be employed as a sacrificial film and may be made of a sacrificial insulation film with a different etching selection rate from the first material films 151. In this case, the first material films 151 may be made of a silicon oxide film, while the second material films 153 may be made of a silicon nitride film.

Otherwise, the first material films 151 may be employed as a sacrificial film and may be made of a sacrificial conductive film with a different etching selection rate from the second material films 153, while the second material films 153 may be made of a conductive film for word-lines and select lines. In this case, the first material films 151 may be made of an undoped poly-silicon film, while the second material films 153 may be made of a doped poly-silicon film.

Thereafter, the first material films 151, the second material films 153, and at least a horizontal portion of the third conductive film 141PG may be etched, resulting in a formation of first and second holes H1_D, H1_S, H2_D, and H2_S which pass therethrough. The holes H1_D, H1_S, H2_D, and H2_S may include a pair of the first holes H1_D and H1_S exposing both ends of the first sacrificial film pattern 111P of each of the base patterns BP, and a pair of the second holes H2_D and H2_S exposing both ends of the second sacrificial film pattern 123P. The pair of the second holes H2_D, and H2_S may be disposed between the pair of the first holes H1_D, and H1_S.

In accordance with an embodiment of the present disclosure, both ends of the first sacrificial film pattern 111P and both ends of the second sacrificial film patterns 123P may be coplanar with each other via a planarization process. In this way, both ends of the first sacrificial film pattern 111P and both ends of the second sacrificial film patterns 123P may allow heights of material layers disposed thereon to be equal to each other. As a result, in the course of the etching for the formation of the first holes H1_D, H1_S and the second holes H2_D, H2_S, the etching depths may be uniform to lead to an enhanced etching stability. In accordance with the embodiment of the present disclosure, the first holes H1_D, H1_S and the second holes H2_D, H2_S may have an equal depth to each other.

Figure 11:
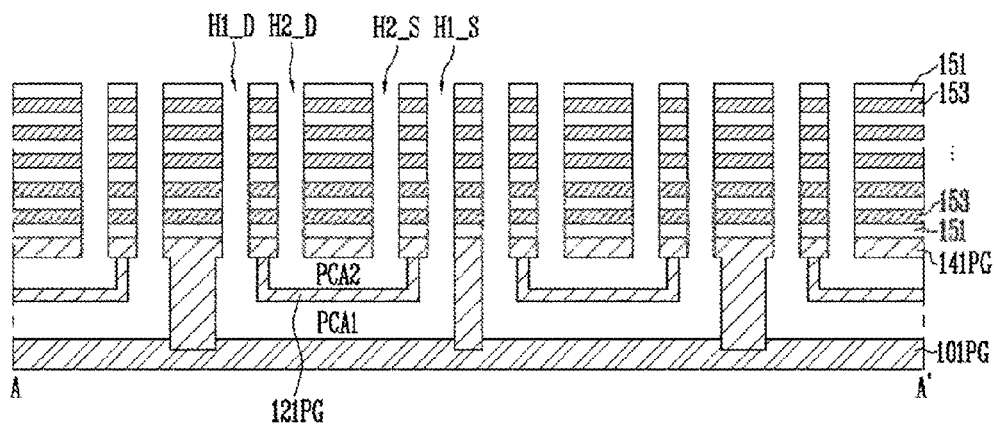

FIG. 11 is a cross-sectional view illustrating a step of opening the first pipe channel region and the second pipe channel region.

Referring to FIG. 11, the first sacrificial film pattern 111P and the second sacrificial film pattern 123P may be removed through the first holes H1_D, H1_S and the second holes H2_D, H2_S. Thus, the removed region of the first sacrificial film pattern 111P may define the first pipe channel region PCA1, while the removed region of the second sacrificial film pattern 123P may define the second pipe channel region PCA2.

Figure 12:
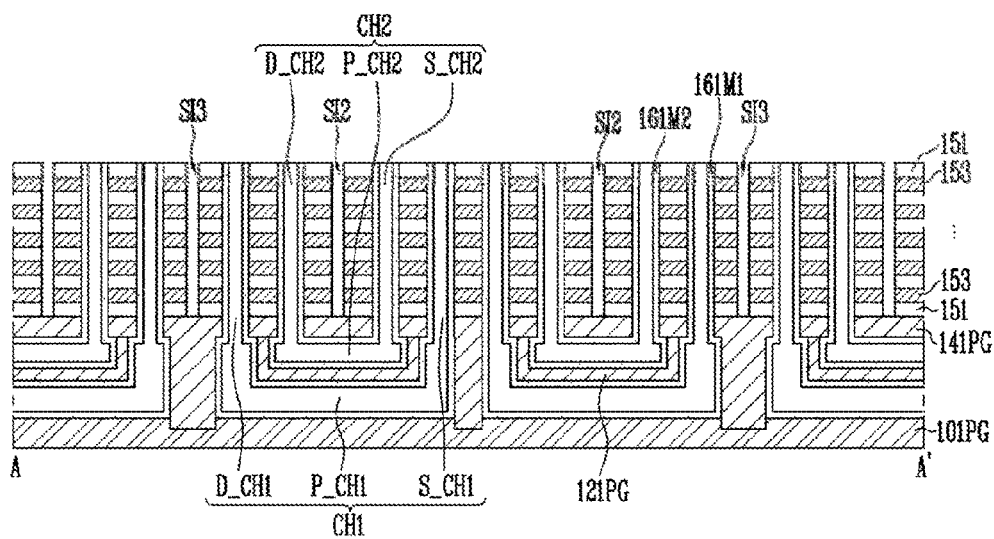

FIG. 12 is a cross-sectional view illustrating a step of forming first and second channel films and second and third slits.

Referring to FIG. 12, a first channel film CH1 and a second channel film CH2 may be formed at the same time. The first channel film CH1 fills the first pipe channel region PCA1 and the pair of the first holes H1_D, and H1_S extending respectively from both ends of the first pipe channel region PCA1. The second channel film CH2 may fill the second pipe channel region PCA2 and the pair of the second holes H2_D, H2_S extending respectively from both ends of the second pipe channel region PCA2.

Prior to the formation of the first and second channel films CH1 and CH2, the first data storage film 161M1 and the second data storage film 161M2 may be formed at the same time. The first data storage film 161M1 and the second data storage film 161M2 may be made of a silicon nitride film to trap a charge. The first data storage film 161M1 may have a tube structure having an extension along the surface of the first pipe channel region PCA1 and along surfaces of the pair of the first holes H1_D and H1_S extending respectively from both ends of the first pipe channel region PCA1. The second data storage film 161M2 may have a tube structure having an extension along the surface of the second pipe channel region PCA2 and along the surfaces of the pair of the second holes H2_D and H2_S extending respectively from both ends of the second pipe channel region PCA2. Although not shown in the figure, prior to the formation of the first and second channel films CH1 and CH2, along the surface of the first data storage film 161M1, a first tunnel insulation film may be formed, and, at the same time, along the surface of the second data storage film 161M2, a second tunnel insulation film may be formed. Moreover, prior to the formation of the first data storage film 161M1 and the second data storage film 161M2, first and second blocking insulation films may be formed at the same time. The first blocking insulation film may have a tube structure having an extension along the surface of the first pipe channel region PCA1 and along the surfaces of the pair of the first holes H1_D and H1_S extending respectively from both ends of the first pipe channel region PCA1. The second blocking insulation film may have a tube structure having an extension along the surface of the second pipe channel region PCA2 and along the surfaces of the pair of the second holes H2_D and H2_S extending respectively from both ends of the second pipe channel region PCA2.

The first channel film CH1 and the second channel film CH2 may be made of semiconductor films. The first channel film CH1 may include the first pipe channel P_CH1 occupying the first pipe channel region PCA1, and the first drain-side channel D_CH1 and the first source-side channel S_CH1 occupying respectively the pair of the first holes H1_D and H1_S. The second channel film CH2 may include the second pipe channel P_CH2 occupying the second pipe channel region PCA2, and the second drain-side channel D_CH2 and the second source-side channel S_CH2 occupying respectively the pair of the second holes H2_D and H2_S. The second drain-side channel D_CH2 and the second source-side channel S_CH2 may be disposed between the first drain-side channel D_CH1 and the first source-side channel S_CH1.

Subsequently, the first and second material films 151 and 153 may be etched, resulting in formation of a second slit SI2 passing through the first and second material films 151 and 153. The second slit SI2 may be disposed between the second holes H2_D, and H2_S. That is, the second slit SI2 may be disposed between the second drain-side channel D_CH2 and the second source-side channel S_CH2. In addition to the second slit SI2, a third slit SI3 may be further formed to divide the first and second material films 151 and 153 on a memory-block basis.

A subsequent process from this point may vary depending on types of materials of the first and second material films 151, and 153.

In one example, if the first material films 151 may be made of an insulation film for an interlayer insulation pattern, and the second material films 153 may be made of a conductive film for word-lines and select lines, then the first material films 151 and the second material films 153 may be divided via second slit SI2 and the third slit SI3 into the source-side stack and the drain-side stack as in FIG. 1.

Figure 13:
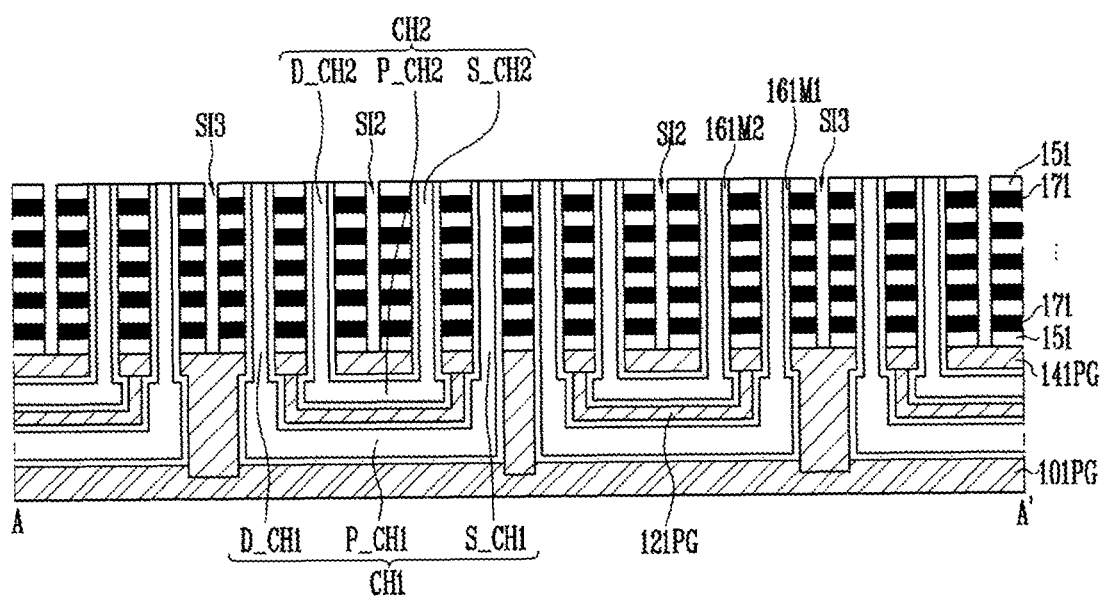

In an alternative, if the first material films 151 may be made of an insulation film for an interlayer insulation pattern, and the second material films 153 may be made of a sacrificial insulation film, the process may move to a stage as shown in FIG. 13.

Referring to FIG. 13, the second material films 153 may be removed through the second slit SI2 and the third slit SI3, to open the conductive pattern regions between the first material films 151. Next, in each of the conductive pattern regions, there may be formed each of conductive patterns 171. The conductive patterns 171 each may be made of a poly-silicon film, a metal silicide film, and/or a metal film. When the first and second tunnel insulation film, the first and second data storage film 161M1 161M2, and the first and second blocking insulation film as above-addressed in connection to FIG. 12 are not formed, prior to the formation of the conductive patterns 171, a tunnel insulation film, a data storage film, and a blocking insulation film may be formed along a surface of each of the conductive pattern regions.

The conductive patterns 171 may act as the word-lines, source select line or drain select line. To be specific, an uppermost film among the conductive patterns 171 may act as the source select line or drain select line, and the patterns below the uppermost film may act as the word-lines. The conductive patterns 171 may be divided via second slit SI2 and the third slit SI3 into the source-side stack and the drain-side stack as above-mentioned in connection to FIG. 1.

Although not shown in the figure, when the first material films 151 may be made of a sacrificial conductive film, and the second material films 153 may be made of a conductive film, the first material films 151 may be divided via second slit SI2 and the third slit SI3 into the source-side stack and the drain-side stack. The second material films 153 may be removed through the second slit SI2 and the third slit SI3, to open the insulation pattern regions between the first material films 151. The insulation pattern regions may be filled with an interlayer insulation patterns.

In accordance with the above-addressed implementation, the second pipe channel P_CH2 may be aligned automatically on the first pipe channel P_CH1 without controlling the alignment using a photolithography device. In this fashion, double overlapping pipe channels may be implemented via a simple process.

In accordance with the present disclosure, the pipe channel region is defined via an alignment of the lower pipe gate and the upper pipe gate, and the pipe channel region is divided into the first and second pipe channel regions via an alignment of the partition pipe gate between the lower pipe gate and the upper pipe gate. In this way, the present disclosure may improve an integration of the memory device via a compact arrangement in a limited space of the first memory string and the second memory string respectively associated with the first pipe channel region and the second pipe channel.

In accordance with the present disclosure, the first trench in the lower pipe gate may be filled with the first sacrificial film, and the second trench may be formed in the first sacrificial film. In this way, the first trench defines the first pipe channel region, and the second trench defines the second pipe channel region, resulting in self-alignment between the second pipe channel region and the first pipe channel region.

In accordance with the present disclosure, defining the first and second pipe channel regions may include the formation of the first and second trenches and the division of material films filling the first and second trenches into multiple base patterns. In this manner, the first and second trenches may be formed with a linear shape without an expensive liquid-immersion lithography device, leading to a cost reduction of manufacturing the semiconductor device.

Figure 14:
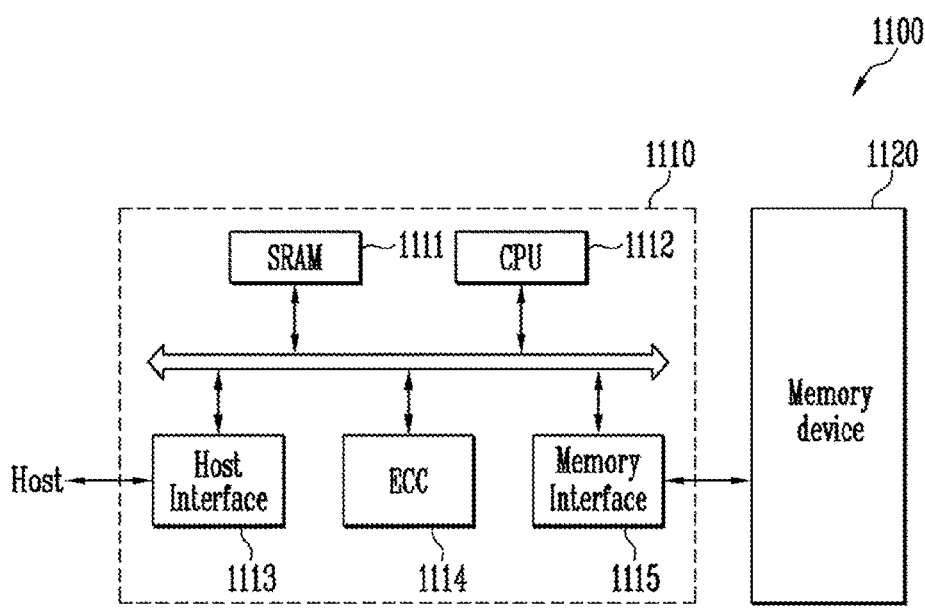
FIG. 14 is a block diagram of a memory system in accordance with one embodiment.

FIG. 14 is a block diagram of a memory system in accordance with one embodiment.

Referring to FIG. 14, the memory system 1100 may include a semiconductor memory device 1120 and a memory controller 1110.

A configuration and operation of the semiconductor memory device 1120 may be as in FIG. 1 to FIG. 13.

Further, the memory device 1120 may be implemented as a multi-chip package including a plurality of flash memory chips.

The memory controller 1110 may be configured to control the memory device 1120, and may include a Static Random Access Memory (SRAM) 1111, a Central Processing Unit (CPU) 1112, a host interface 1113, an error correcting code memory (ECC) 1114, and a memory interface 1115. The SRAM 1111 may act as work memory for the CPU 1112; the CPU 1112 may control all operations for data exchange of the memory controller 1110; the host interface 1113 may have a data exchange protocol between the memory system 1100 and a host system coupled to the memory system 1100. Further, the ECC 1114 may detect and correct an error in data read from the memory device 1120; and the memory interface 1115 may interface the memory device 1120. In addition, the memory controller 1110 may further include a ROM to store code data to interface the host system.

The memory system 1100 may be implemented in a memory card or SSD Solid State Disk (SSD) as a combination of the memory device 1120 and controller 1110. In one example, when the memory system 1100 is implemented as the SSD, the memory controller 1110 may communicate with an external device (e.g., host system) via various interface protocols such as Universal Serial Bus (USB), Multi-Media Card (MMC), Peripheral Component Interconnect Extended (PCI-E), Serial Advanced Technology Attachment (SATA), Parallel Advanced Technology Attachment (PATA), Small Computer System Interface (SCSI), Enhanced Small Device Interface (ESDI), Integrated Drive Electronics (IDE), etc.

Figure 15:
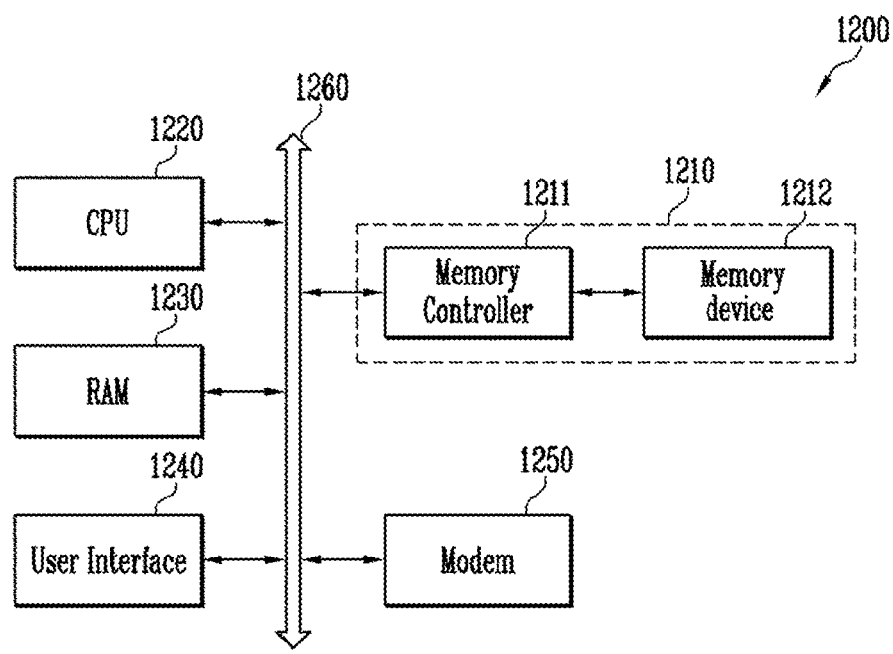
FIG. 15 is a configuration diagram of a computing system in accordance with one implementation of the present disclosure.

FIG. 15 is a configuration diagram of a computing system in accordance with one implementation of the present disclosure.

Referring to FIG. 15, the computing system 1200 in accordance with one implementation of the present disclosure may include a CPU 1220, RAM 1230, a user interface 1240, a modem 1250, and a memory system 1210, all of which are electrically connected to each other via a system bus 1260. Further, when the computing system 1200 is implemented in a mobile device, the computing system 1200 may be further provided with a battery (not shown) to supply an operation voltage thereof, and may be further provided with an application chipset, camera image processor (CIS), mobile DRAM, etc.

The memory system 1210 may also include the memory device 1212, and the memory device controller 1211 as above-mentioned in FIG. 14.

The above description is not to be taken in a limiting sense, but is made merely for the purpose of describing the general principles of exemplary embodiments, many additional embodiments of this invention are possible. It is understood that no limitation of the scope of the invention is thereby intended. The scope of the disclosure should be determined with reference to the Claims. Reference throughout this specification to "one embodiment," "an embodiment," or similar language means that a particular feature, structure, or characteristic that is described in connection with the embodiment is included in at least one embodiment of the present disclosure. Thus, appearances of the phrases "in one embodiment," "in an embodiment," and similar language throughout this specification may, but do not necessarily, all refer to the same embodiment.

What is claimed is:

1. A method of manufacturing a semiconductor device, comprising:
    forming a first conductive film having first trenches formed therein, each of the first trenches extending in a first direction;
    forming a first sacrificial film filling the first trenches;
    etching the first sacrificial film to form second trenches, each second trench extending in the first direction;
    forming a second conductive film and a second sacrificial film on the second conductive film, the second conductive film being formed on an inner surface of each of the second trenches, and the second sacrificial film filling each of the second trenches;
    forming first slits dividing the first sacrificial film, the second conductive film and the second sacrificial film into a plurality of base patterns;
    forming a third conductive film having a horizontal portion covering the base patterns and protrusions extending from the horizontal portion so as to fill the first slits; and
    forming a pair of first holes and a pair of second holes, the first holes passing through the horizontal portion so as to expose the first sacrificial film of each of the base patterns, and the second holes passing through the horizontal portion so as to expose the second sacrificial film of each of the base patterns.

2. The method of claim 1, wherein the first slits includes first, second and third types slits,
    wherein the adjacent first type slits sandwich one first trench therebetween, each first type silt extending in the first direction;
    wherein the second type slit is disposed between the adjacent second trenches, the second type silt extending in the first direction;
    wherein each of the third type slits connects between the first and second slits, each third type slit extending in a direction crossing the first direction.

3. The method of claim 2, wherein the adjacent first type slits expose respectively side-walls of the first sacrificial film.

4. The method of claim 1, wherein each of the first slits has a lager depth than the first trenches.

5. The method of claim 1, wherein the base patterns are arranged in a linear manner in the first direction and are arranged in a staggered manner in a second direction perpendicular to the first direction.

6. The method of claim 5, wherein each of the base patterns extends in a direction crossing the first and second direction in a non-perpendicular manner.

7. The method of claim 1, wherein a surface of each of the base patterns is planar.

8. The method of claim 1, wherein the first holes and the second holes have the same depth.

9. The method of claim 1, further comprising forming above the third conductive film a stack of vertical alternations of first material films and second material films,
    wherein the first and second holes pass through the first material films, the second material films and the horizontal portion of the third conductive film.

10. The method of claim 9, further comprising;
    removing the first and second sacrificial films through the first and second holes;
    forming first and second channel films, the first channel film filling the first holes and a removed region of the first sacrificial film, and the second channel film filling the second holes and a removed region of the second sacrificial film; and
    forming a second slit, the second slit passing through the first material films and the second material films, wherein the second slit is disposed between the second holes so as to divide the first material films and the second material films into the source-side stack and the drain-side stack.

* * * * *